US011757550B2

(12) United States Patent
Iyer et al.

(10) Patent No.: US 11,757,550 B2
(45) Date of Patent: Sep. 12, 2023

(54) ETHERNET INTERFACE AND RELATED SYSTEMS, METHODS AND DEVICES

(71) Applicant: Microchip Technology Incorporated, Chandler, AZ (US)

(72) Inventors: Venkatraman Iyer, Austin, TX (US); Dixon Chen, Guangdong (CN); John Junling Zang, Guangdong (CN); Shivanand I. Akkihal, Austin, TX (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/452,661

(22) Filed: Oct. 28, 2021

(65) Prior Publication Data

US 2022/0052775 A1 Feb. 17, 2022

Related U.S. Application Data

(63) Continuation of application No. 16/684,419, filed on Nov. 14, 2019, now Pat. No. 11,171,732.

(30) Foreign Application Priority Data

Aug. 23, 2019 (CN) .......................... 201910784382.4

(51) Int. Cl.
*H04J 3/06* (2006.01)
(52) U.S. Cl.
CPC .................................. *H04J 3/062* (2013.01)

(58) Field of Classification Search
CPC ......... H04J 3/062; H04J 3/0697; H04L 12/02; H04L 12/4013; H04L 12/321; H04L 12/413; H04L 12/40; G06F 1/12; H03K 5/135
See application file for complete search history.

(56) References Cited

U.S. PATENT DOCUMENTS

| 4,739,276 A | 4/1988 | Graube |
| 4,970,466 A | 11/1990 | Bolles et al. |
| 5,134,377 A | 7/1992 | Reddy et al. |
| 5,305,459 A | 4/1994 | Rydel |
| 5,357,145 A | 10/1994 | Segaram |

(Continued)

FOREIGN PATENT DOCUMENTS

| CN | 101127928 A | 2/2008 |
| CN | 101616048 A | 12/2009 |

(Continued)

OTHER PUBLICATIONS

Fitzgerald: "10BASE-T1L Low Power Idle (802.3cg D2.0)", IEEE-SA, Acuitas Silicon, (Aug. 15, 2018) 9 pages.

(Continued)

*Primary Examiner* — Chi H Pham
*Assistant Examiner* — Vladislav Y Agureyev
(74) *Attorney, Agent, or Firm* — TraskBritt

(57) ABSTRACT

Described is a digital interface and related systems, method and devices. In some embodiments, an interface may be an interface between a link layer and a physical transmission medium. The interface may be configured for a bit rate and/or reference clock that limits electromagnetic emissions (EME), for example, as compared to a bit rate and/or clock rate specified by interfaces widely used in industry.

20 Claims, 4 Drawing Sheets

(56) References Cited

U.S. PATENT DOCUMENTS

| | | |
|---|---|---|
| 5,381,348 A | 1/1995 | Ernst et al. |
| 5,581,556 A | 12/1996 | Ohie |
| 5,784,573 A | 7/1998 | Szczepanek et al. |
| 5,859,554 A | 1/1999 | Higashisaka et al. |
| 5,892,893 A | 4/1999 | Hanf et al. |
| 6,029,202 A | 2/2000 | Frazier et al. |
| 6,115,831 A | 9/2000 | Hanf et al. |
| 6,185,195 B1 | 2/2001 | Leung |
| 6,192,422 B1 | 2/2001 | Daines et al. |
| 6,215,816 B1 | 4/2001 | Gillespie et al. |
| 6,459,739 B1 | 10/2002 | Vitenberg |
| 6,463,543 B1 | 10/2002 | Alvarez |
| 6,479,983 B1 | 11/2002 | Ebiya |
| 6,691,241 B1 | 2/2004 | Taylor |
| 6,735,217 B1 | 5/2004 | Webber et al. |
| 6,920,132 B1 | 7/2005 | Lo |
| 6,973,094 B1 | 12/2005 | Holloway et al. |
| 7,110,423 B1 | 9/2006 | Sethuram et al. |
| 7,319,705 B1 | 1/2008 | Wu et al. |
| 7,558,348 B1 | 7/2009 | Liu et al. |
| 7,906,973 B1 | 3/2011 | Orr |
| 8,243,752 B2 | 8/2012 | Barkan et al. |
| 8,935,125 B1 | 1/2015 | Fu et al. |
| 9,454,212 B1 | 9/2016 | Schulze |
| 9,628,082 B1 | 4/2017 | Smith et al. |
| 9,696,361 B1 | 7/2017 | Sun et al. |
| 10,684,977 B1 | 6/2020 | Seger et al. |
| 10,863,386 B1* | 12/2020 | Anand ............... H04J 3/0647 |
| 11,218,964 B2 | 1/2022 | Chae et al. |
| 2002/0162038 A1 | 10/2002 | Bullman et al. |
| 2003/0061341 A1 | 3/2003 | Loh et al. |
| 2003/0126486 A1 | 7/2003 | Bui |
| 2003/0200306 A1 | 10/2003 | Park et al. |
| 2003/0225802 A1 | 12/2003 | Ruthstein et al. |
| 2004/0028164 A1 | 2/2004 | Jiang et al. |
| 2004/0145500 A1 | 7/2004 | Huebl |
| 2004/0240598 A1 | 12/2004 | Yin |
| 2004/0251912 A1 | 12/2004 | Pharn et al. |
| 2005/0063116 A1 | 3/2005 | Rotheroe |
| 2005/0078683 A1 | 4/2005 | Page |
| 2005/0128826 A1 | 6/2005 | Kwack et al. |
| 2006/0109784 A1 | 5/2006 | Weller et al. |
| 2006/0181283 A1 | 8/2006 | Wajcer et al. |
| 2006/0209710 A1 | 9/2006 | Watanabe |
| 2007/0008011 A1 | 1/2007 | Thurston |
| 2007/0069768 A1 | 3/2007 | Hatooka et al. |
| 2007/0121624 A1 | 5/2007 | Kimbrough et al. |
| 2007/0133586 A1 | 6/2007 | Ojard et al. |
| 2007/0160087 A1 | 7/2007 | Findlater et al. |
| 2008/0024178 A1 | 1/2008 | Kim et al. |
| 2008/0037693 A1 | 2/2008 | Andrus et al. |
| 2008/0117810 A1 | 5/2008 | Stott et al. |
| 2008/0159330 A1 | 7/2008 | Deng et al. |
| 2008/0162682 A1 | 7/2008 | Ramachandran et al. |
| 2008/0186996 A1 | 8/2008 | Powell et al. |
| 2009/0003835 A1 | 1/2009 | Arahira |
| 2009/0201936 A1 | 8/2009 | Dumet et al. |
| 2010/0202436 A1 | 8/2010 | Albert et al. |
| 2011/0022699 A1 | 1/2011 | Powell et al. |
| 2011/0028104 A1 | 2/2011 | Giombanco et al. |
| 2011/0170476 A1 | 7/2011 | Shapira et al. |
| 2012/0087662 A1 | 4/2012 | Suzuki et al. |
| 2012/0155476 A1* | 6/2012 | Pavani ............... H04J 3/0632 370/400 |
| 2012/0229214 A1 | 9/2012 | Kasanyal |
| 2012/0307637 A1 | 12/2012 | Diab |
| 2013/0007480 A1 | 1/2013 | Wertheimer et al. |
| 2013/0021063 A1 | 1/2013 | Kwon |
| 2013/0101058 A1 | 4/2013 | Hummel |
| 2013/0159489 A1 | 6/2013 | Cha et al. |
| 2013/0162300 A1 | 6/2013 | Liu et al. |
| 2013/0229926 A1 | 9/2013 | Lu et al. |
| 2013/0329773 A1 | 12/2013 | Cheng et al. |
| 2014/0073352 A1 | 3/2014 | Aldana et al. |
| 2014/0177653 A1 | 6/2014 | Tzeng |
| 2014/0268141 A1 | 9/2014 | Pariseau |
| 2014/0281626 A1 | 9/2014 | Younger et al. |
| 2015/0063375 A1 | 3/2015 | Tzeng et al. |
| 2015/0124797 A1 | 5/2015 | Babitch et al. |
| 2015/0131708 A1 | 5/2015 | Cornett et al. |
| 2015/0145563 A1 | 5/2015 | Pardoen |
| 2015/0145581 A1 | 5/2015 | Palmer et al. |
| 2015/0205339 A1 | 7/2015 | Park et al. |
| 2015/0237178 A1 | 8/2015 | Zhang |
| 2015/0370312 A1 | 12/2015 | Desposito et al. |
| 2016/0094362 A1 | 3/2016 | Brennan |
| 2016/0156458 A1* | 6/2016 | Babitch ............... H04W 56/001 370/503 |
| 2016/0323287 A1 | 11/2016 | Kishikawa et al. |
| 2016/0337138 A1 | 11/2016 | Gardner et al. |
| 2017/0046298 A1 | 2/2017 | Yu et al. |
| 2017/0111069 A1 | 4/2017 | Dafesh et al. |
| 2017/0134152 A1* | 5/2017 | Yamamoto ............ H04J 3/0608 |
| 2017/0187479 A1* | 6/2017 | Yamamoto ............ H04J 3/0638 |
| 2017/0214513 A1* | 7/2017 | Asada ........................ H04L 7/02 |
| 2017/0257273 A1* | 9/2017 | Li ............................. H04L 43/08 |
| 2017/0346620 A1* | 11/2017 | Bucci .................... H04L 27/08 |
| 2018/0034658 A1 | 2/2018 | Kinage et al. |
| 2018/0062821 A1* | 3/2018 | Mamidwar ........... H04L 5/0007 |
| 2018/0091251 A1* | 3/2018 | Hanneman, Jr. .... H04J 14/0283 |
| 2018/0165056 A1 | 6/2018 | Lay et al. |
| 2018/0181525 A1 | 6/2018 | Iyer et al. |
| 2018/0220161 A1* | 8/2018 | Schierl ................... H04N 19/46 |
| 2018/0262526 A1 | 9/2018 | Jain et al. |
| 2018/0314285 A1 | 11/2018 | Susanto et al. |
| 2018/0331776 A1* | 11/2018 | Wang .................... H04B 10/25 |
| 2019/0179398 A1 | 6/2019 | Arora et al. |
| 2019/0199537 A1 | 6/2019 | Seo et al. |
| 2019/0230705 A1 | 7/2019 | Beruto et al. |
| 2019/0261420 A1 | 8/2019 | Pannell et al. |
| 2019/0268941 A1 | 8/2019 | Axer et al. |
| 2019/0313446 A1 | 10/2019 | Kim et al. |
| 2019/0357146 A1 | 11/2019 | Kim et al. |
| 2019/0361711 A1 | 11/2019 | Kim et al. |
| 2019/0363991 A1 | 11/2019 | Sostawa et al. |
| 2019/0385057 A1* | 12/2019 | Litichever ............... H04L 63/14 |
| 2020/0136993 A1 | 4/2020 | Yun et al. |
| 2020/0153174 A1 | 5/2020 | Curtis et al. |
| 2020/0295957 A1 | 9/2020 | Kim et al. |
| 2020/0343993 A1 | 10/2020 | Rentschler et al. |
| 2020/0351943 A1 | 11/2020 | Iyer et al. |
| 2020/0367096 A1 | 11/2020 | Hwang et al. |
| 2020/0371579 A1 | 11/2020 | Selvam et al. |
| 2021/0055963 A1 | 2/2021 | An et al. |
| 2021/0056060 A1 | 2/2021 | An et al. |
| 2021/0058168 A1 | 2/2021 | Zang et al. |
| 2021/0058177 A1 | 2/2021 | Iyer et al. |
| 2021/0058224 A1 | 2/2021 | Iyer et al. |
| 2021/0058269 A1 | 2/2021 | Zang et al. |
| 2021/0058498 A1 | 2/2021 | Iyer et al. |
| 2021/0058965 A1 | 2/2021 | Chen et al. |
| 2021/0067907 A1* | 3/2021 | Sze .................. H04N 21/64723 |
| 2021/0282087 A1 | 9/2021 | Den Besten |
| 2021/0303050 A1 | 9/2021 | Ching et al. |
| 2022/0046114 A1* | 2/2022 | Entelis ................... H04L 69/08 |

FOREIGN PATENT DOCUMENTS

| | | |
|---|---|---|
| CN | 1866803 B | 5/2012 |
| CN | 102813530 A | 12/2012 |
| CN | 204392278 U | 6/2015 |
| CN | 106031098 A | 10/2016 |
| CN | 107836131 A | 3/2018 |
| DE | 102018105007 A1 | 9/2019 |
| DE | 112019002669 T5 | 3/2021 |
| DE | 112020002093 T5 | 1/2022 |
| EP | 0620664 | 10/1994 |
| EP | 1388975 A1 | 2/2004 |
| EP | 1940086 A1 | 7/2008 |
| EP | 3094044 A1 | 11/2016 |
| EP | 3573287 A1 | 11/2019 |
| EP | 3618364 A1 | 3/2020 |

(56) References Cited

FOREIGN PATENT DOCUMENTS

OTHER PUBLICATIONS

International Search Report from International Application No. PCT/US2020/070366, dated Nov. 24, 2020, 4 pages.
International Written Opinion from International Application No. PCT/US2020/070366, dated Nov. 24, 2020, 7 pages.
LAN/MAN Standards Committee of the IEEE Computer Society, "Draft Standard for Ethernet Amendment: Physical Layer Specifications and Management Parameters for 10 Mb/s Operation and Associated Power Delivery over a Single Balanced Pair of Conductors," IEEE Draft, P802.3cg/D2.4, Feb. 21, 2019, The Institute of Electrical and Electronics Engineers, Inc., pp. 1-60, New York.
Meier, "Analysis of Worst Case Latencies in an 10 Mbit Ethernet network with PLCA", IEEE Draft, V4, Jan. 17, 2018, pp. 1-11.
Microchip KSZ8061MNX/MNG, "100BASE-T/100BASE-TX Physical Layer Transceiver" Device Document 00002038D (Aug. 15, 2018) 66 pages.
Pannell et al., "Quality of Service for PLCA", NXP, May 2018 (May 24, 2018), pp. 1-37, vol. 802.1, No. v02 24, Pittsburg.
U.S. Appl. No. 62/881,720, filed Aug. 1, 2019, titled "Single Pair Ethernet Physical Layer Architecture and Systems, Devices, and Me I Hods for Implementing the Same", to Iyer et al., 35 pages.
Chinese Office Action and Search Report from Chinese Application No. 201910784382.4, dated Mach 3, 2022, 19 pages.
Chinese Second Office Action for Chinese Application No. 201910784382.4, dated Sep. 16, 2022, 5 pages with translation.
Microsoft. "P." Microsoft Computer Dictionary, 5th ed., Penguin Books, 2002. (Year: 2002).
U.S. Appl. No. 62/993,825, filed Mar. 24, 2020, titled "Low Pin Count Handshake Signaling Protocol According to 10BASE-T1X Local and Remote Wake De I Ect and Related Systems, Me I Hods, and Devices", to Iyer et al., 13 pages.
Zimmerman et al., "IEEE P802.3cg 10Mb/s Single Pair Ethernet: A guide", Long Beach, CA, USA, Jan. 16, 2019. (Year: 2019).

* cited by examiner

ETHERNET INTERFACE AND RELATED SYSTEMS, METHODS AND DEVICES

PRIORITY CLAIM

This application is a continuation of U.S. patent application Ser. No. 16/684,419, filed Nov. 14, 2019, now U.S. Pat. No. 11,171,732, issued Nov. 9, 2021, which claims the benefit of the filing date of Chinese Provisional Patent Application Serial No. 201910784382.4, filed Aug. 23, 2019, for "ETHERNET INTERFACE AND RELATED SYSTEMS METHODS AND DEVICES."

TECHNICAL FIELD

Disclosed embodiments relate, generally, to Ethernet, and more specifically, some embodiments relate to an interface that limits electromagnetic emissions (EME).

BACKGROUND

Interconnects are widely used to facilitate communication among devices of a network. Generally speaking, electrical signals are transmitted on a physical medium (e.g., a bus, a coaxial cable, or a twisted pair—but generally referred to simply as a "line") by the devices coupled to the physical medium.

According to the Open Systems Interconnection model (OSI model), Ethernet-based computer networking technologies use baseband transmission (i.e., electrical signals are discrete electrical pulses) to transmit data packets and ultimately messages that are communicated among network devices. According to the OSI model, specialized circuitry called a physical layer (PHY) device or controller is used to interface between an analog domain of a line and a digital domain of a data link layer (also referred to herein simply as a "link layer") that operates according to packet signaling. While the data link layer may include one or more sublayers, in Ethernet-based computer networking, a data link layer typically includes at least a media access control (MAC) layer that provides control abstraction of the physical layer. By way of example, when transmitting data to another device on a network, a MAC controller may prepare frames for the physical medium, add error correction elements, and implement collision avoidance. Further, when receiving data from another device, a MAC controller may ensure integrity of received data and prepare frames for higher layers.

There are various network topologies that implement physical layers and link layers (and may include other layers, without limitation). The Peripheral Component Interconnect (PCI) standard and the Parallel Advanced Technology Attachment (Parallel ATA), both around since the early 1990s, may implement a multi-drop bus topology. The trend since the early 2000s has been to use point-to-point bus topologies, for example, the PCI Express standard and the Serial ATA (SATA) standard implement point-to-point topologies.

A typical point-to-point bus topology may implement lines between each device (e.g., dedicated point-to-point) or lines between devices and switches (e.g., switched point-to-point, without limitation). In a multi-drop topology, a physical medium is a shared bus and each network device is coupled to the shared bus, for example, via a circuit chosen based on the type of physical medium (e.g., coaxial or twisted pair, without limitation).

Point-to-point bus topologies, such as a dedicated point-to-point topology or a switched point-to-point topology, require more wires and more expensive material than multi-drop topologies due, in part, to the greater number of links between devices. In certain applications, such as automotive, there may be physical constraints that make it difficult to directly connect devices, and so a topology that does not require, or does not require as many, direct connections (e.g., a multi-drop topology, without limitation) in a network or a sub-network may be less susceptible to such constraints.

Devices that are on a baseband network (e.g., a multi-drop network without limitation) share the same physical transmission medium, and typically use the entire bandwidth of that medium for transmission (stated another way, a digital signal used in baseband transmission occupies the entire bandwidth of the media). As a result, only one device on a baseband network may transmit at a given instant. So, media access control methods are used to handle contention for a shared transmission medium.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
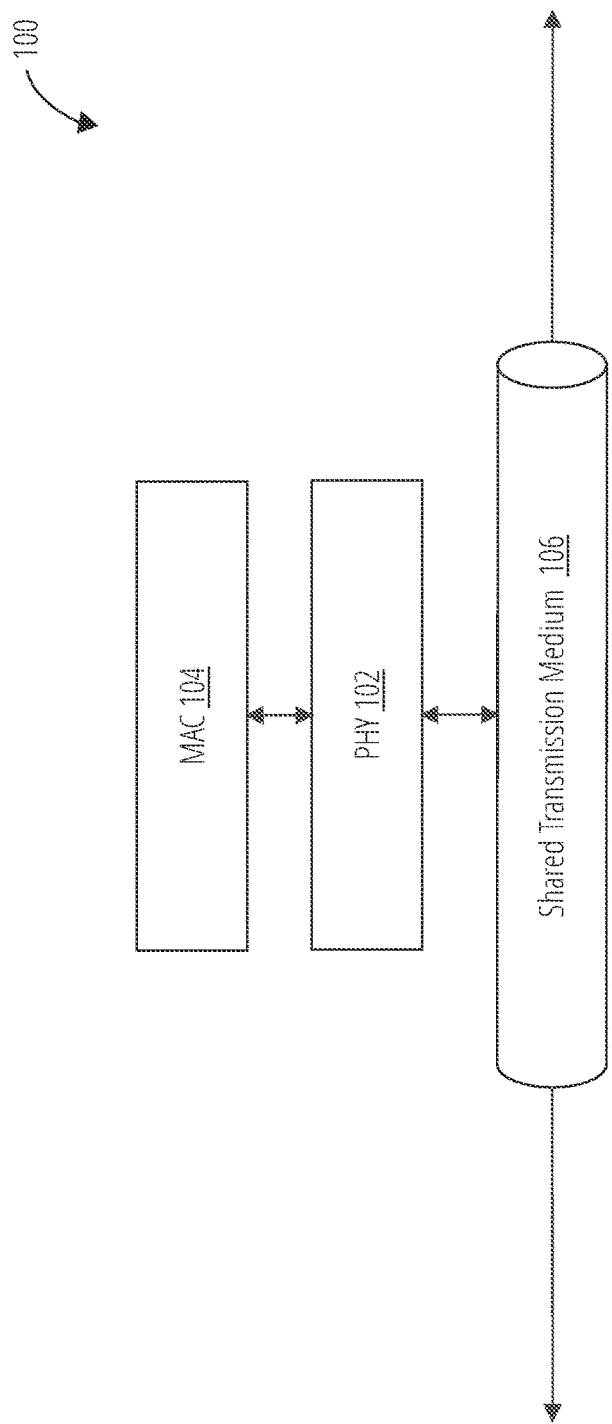
FIG. 1 illustrates a network segment in accordance with one or more embodiments.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

It will be readily understood that the components of the embodiments as generally described herein and illustrated in the drawings may be arranged and designed in a wide variety of different configurations. Thus, the following description of various embodiments is not intended to limit the scope of the present disclosure, but is merely representative of various embodiments.

The following description may include examples to help enable one of ordinary skill in the art to practice the disclosed embodiments. The use of the terms "exemplary,"

"by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

Thus, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Information and signals described herein may be represented using any of a variety of different technologies and techniques. For example, data, instructions, commands, information, signals, bits, and symbols that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the disclosure may be implemented on any number of data signals including a single data signal.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

It should be understood that any reference to an element herein using a designation such as "first," "second," and so forth does not limit the quantity or order of those elements, unless such limitation is explicitly stated. Rather, these designations are used herein as a convenient method of distinguishing between two or more elements or instances of an element. Thus, a reference to first and second elements does not mean that only two elements can be employed or that the first element must precede the second element in some manner. Also, unless stated otherwise a set of elements may comprise one or more elements. Likewise, sometimes elements referred to in the singular form may also include one or more instances of the element.

The various illustrative logical blocks, modules, and circuits described in connection with the embodiments disclosed herein may be implemented or performed with a general purpose processor, a special purpose processor, a Digital signal Processor (DSP), an Application Specific Integrated Circuit (ASIC), a Field-Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

Also, it is noted that the embodiments may be described in terms of a process that is depicted as a flowchart, a flow diagram, a structure diagram, or a block diagram. Although a flowchart may describe operational acts as a sequential process, many of these acts may be performed in another sequence, in parallel, or substantially concurrently. In addition, the order of the acts may be re-arranged. A process may correspond to a method, a thread, a function, a procedure, a subroutine, or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In disclosed embodiments, unless otherwise stated, a collision should be understood to refer to a logical collision (i.e., an actual collision is inferred/predicted but signals from different nodes are not necessarily present on a shared transmission medium at the same time).

Protocols may be performed at a physical layer for media access tuning. For example, 10SPE (i.e., 10 Mbps Single Pair Ethernet) is a network technology specification currently under development by the Institute of Electrical and electronics Engineers (IEEE) as IEEE 802.3 cg™, and the 10SPE specification includes an optional PLCA reconciliation sublayer, which, in theory, may be used to avoid collisions on a multi-drop bus. Other media access tuning protocols may be implemented in a PHY including time aware protocols and traffic shaping protocols. Generally speaking, one advantage of performing media access tuning is that a MAC may still receive data after a collision is detected because the receive data that caused a collision should not be corrupted by transmit data. However, some legacy MACs assume that any collision is an actual collision and so are configured to back off and ignore any receive data on a receive data line.

Some embodiments of this disclosure relate, generally, to a process for improved handling of a data reception after a collision that accounts for behavior of some legacy MACs, and systems configured to implement the same.

FIG. 1 shows a functional block diagram of a network segment 100 including a link layer device, MAC 104 and a physical layer (PHY) device, PHY 102. As non-limiting examples, network segment 100 may be a segment of a multi-drop network, a segment of a multi-drop sub-network, a multi-drop bus that is a segment of a mixed media network, or a combination or sub-combination thereof. As non-limiting examples, network segment 100 may be, be part of, or include one or more of a microcontroller-type embedded system, a user-type computer, a computer server, a notebook computer, a tablet, a handheld device, a mobile device, a wireless earbud device or headphone device, a wired earbud or headphone device, an appliance sub-system, lighting sub-system, sound sub-system, building control systems, residential monitoring system (e.g., for security or utility usage, without limitation), elevator system or sub-system, public transit control system (e.g., for above ground train, below ground train, trolley, or bus, without limitation), an automobile system or automobile sub-system, or an industrial control system, without limitation.

PHY 102 is configured to interface with MAC 104. As non-limiting examples, PHY 102 and/or MAC 104 may be chip packages including memory and/or logic configured for carrying out all or portions of embodiments described herein. As non-limiting examples, PHY 102 and MAC 104, respectively, may be implemented as separate chip packages or circuitry (e.g., integrated circuits) in a single chip package (e.g., a system-in-a-package (SIP)).

PHY 102 is also configured to interface with shared transmission medium 106, a physical medium that is a communication path for nodes that are, for example, part of network segment 100 or a network of which network segment 100 is a part, including nodes that include PHY 102 and MAC 104. As a non-limiting example, shared transmission medium 106 may be a single twisted pair such as used for single pair Ethernet.

In the example shown in FIG. 1, MAC 104 is configured to be traffic aware, and more specifically, is configured to implement collision detection and/or avoidance protocols. In one embodiment, MAC 104 is configured to perform carrier-sense multiple access (CSMA). More specifically, MAC 104 is configured to check for a carrier on shared transmission medium 106, and if it detects a carrier then it waits until no carrier is detected (i.e., the channel is idle) before beginning data transmission.

Figure 2:
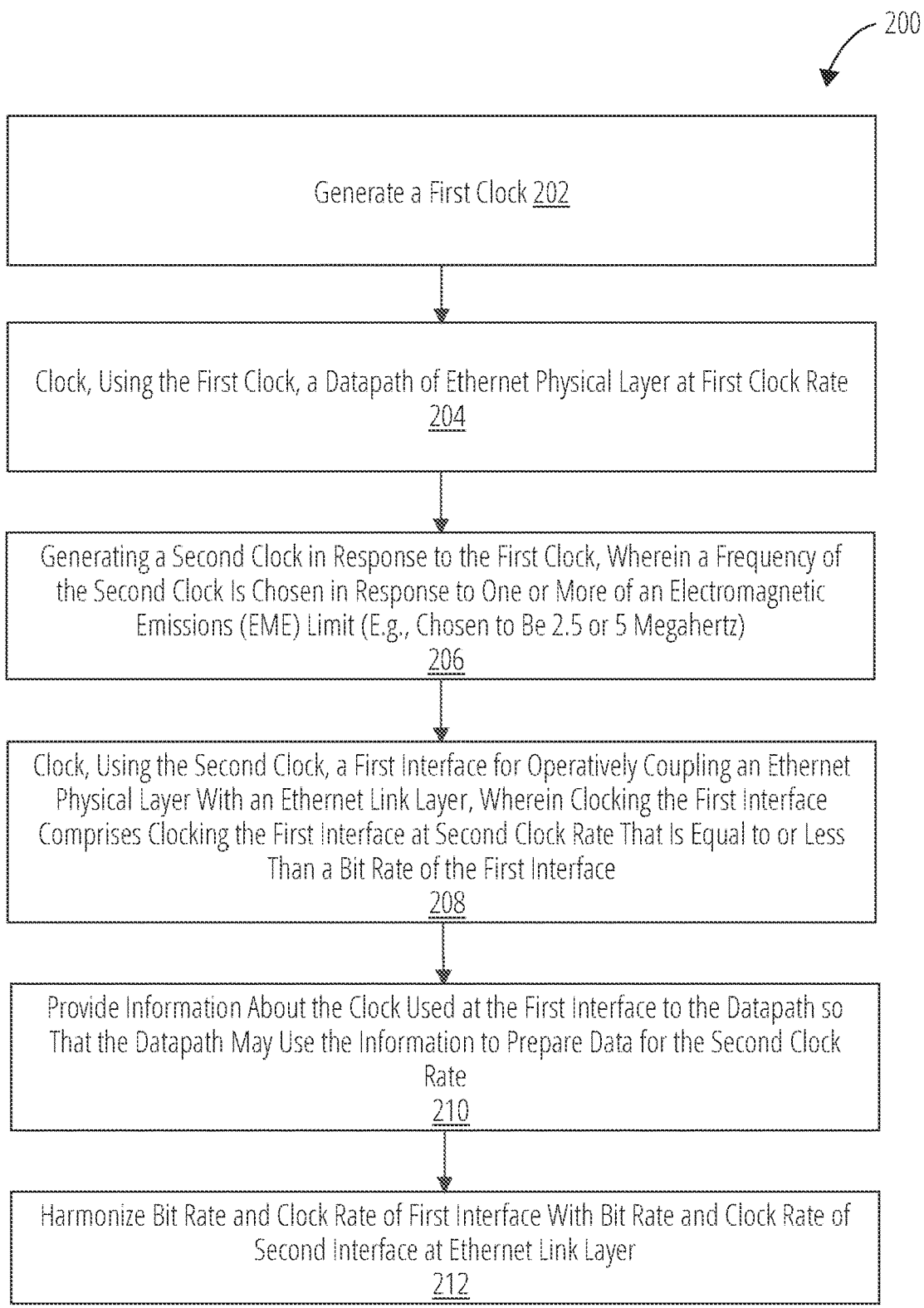
FIG. 2 illustrates a routine in accordance with one or more embodiments.

FIG. 2 shows a flow chart of a process 200 for a domain crossing method according to one or more embodiments. In operation 202, process 200 generates a clock. In one embodiment, the clock is generated at a frequency of a local crystal oscillator. In one embodiment, the clock rate of the clock generated in operation 202 is 25 megahertz and the crystal oscillator is a 25 megahertz crystal oscillator.

In operation 204, process 200 clocks, using the clock, a datapath of an Ethernet physical layer at a first clock rate. In one embodiment, one or more operational blocks of the datapath are clocked at the clock rate of the clock generated in operation 202.

In operation 206, process 200 clocks, using the clock, a first interface for operatively coupling the Ethernet physical layer with an Ethernet link layer, wherein clocking the first interface comprises clocking the first interface at a second clock rate that is equal to or less than a bit rate of the interface. In one embodiment, a bit rate of the first interface is chosen to limit electromagnetic emissions (EME). In one embodiment, the first interface is clocked at 5 megahertz. In one embodiment, the clock is divided and a divided clock having a frequency corresponding to the second clock rate is used to clock the first interface at the second clock rate. In one embodiment, information about the divided clock is provided to the datapath that operates on the first clock.

In operation 210, process 200 provides information about the clock used at the first interface. The datapath, which is clocked at the first clock rate, uses the information about the second clock rate to prepare data for the second clock rate. In one embodiment, information about the second clock rate may include phase information.

In operation 212, process 200 synchronizes the bit rate and the clock rate of the first interface with a bit rate and a clock rate of a second interface at the Ethernet link layer.

Figure 3:
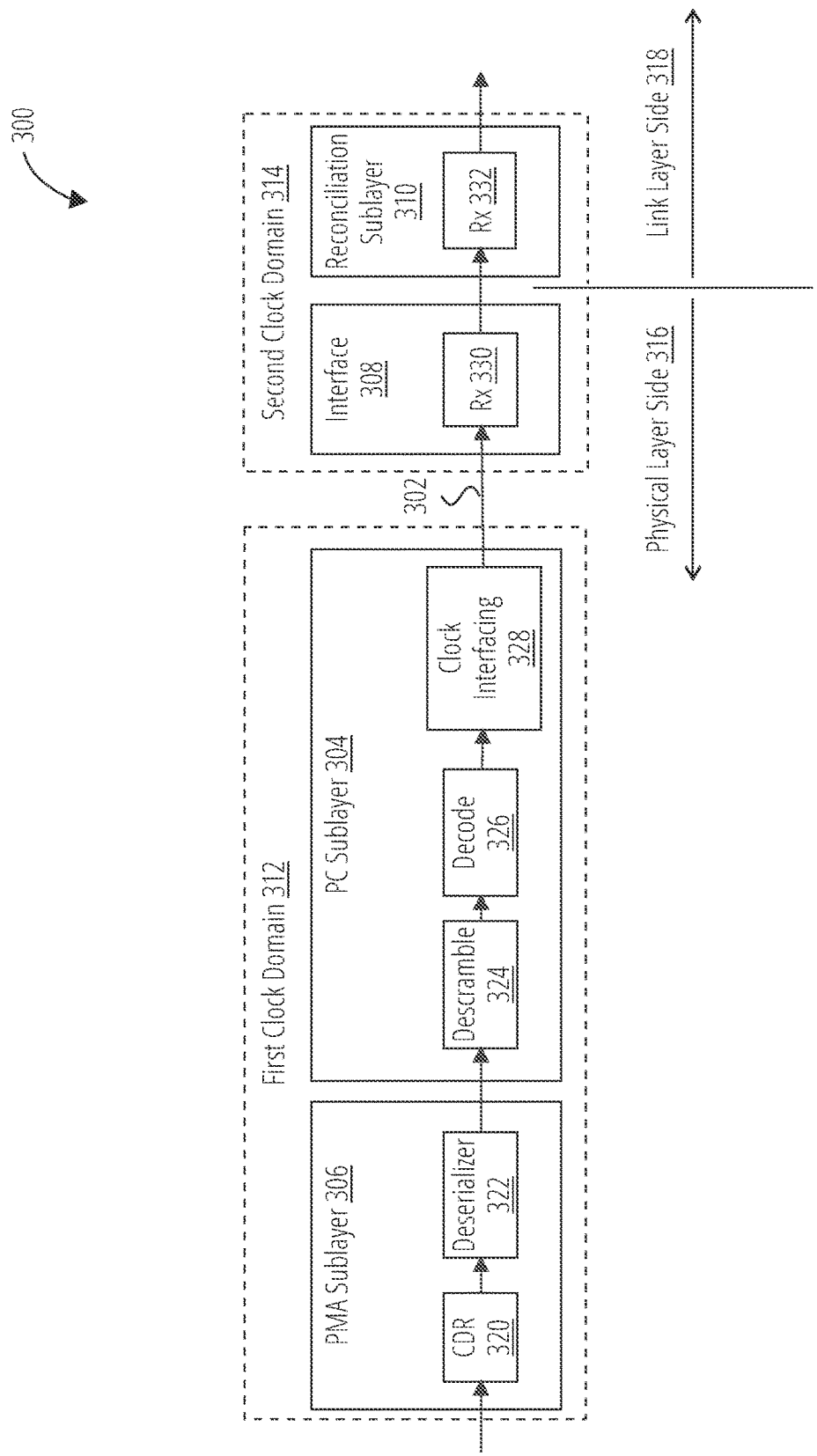
FIG. 3 illustrates a datapath in accordance with one or more embodiments.

FIG. 3 shows a functional block diagram of a datapath 300 that includes two clock domains, first clock domain 312 and second clock domain 314. First clock domain 312 may be chosen, as a non-limiting example, because it is, or is based on, a frequency of local crystal oscillator. Second clock domain 314 may be chosen, as a non-limiting example, because it is a frequency that is associated with lower EME than the frequency of the first clock domain.

In the embodiment of FIG. 3, first clock domain 312 includes two sublayers of PHY 102: physical medium attachment (PMA) sublayer 306 and physical coding (PC) sublayer 304. Both of these sublayers and their functional blocks, CDR 320, Deserializer 322, descramble 324, decode 326, and clock interfacing 328 operate in first clock domain 312. In this embodiment, PC sublayer 304 includes a functional block, clock interface. Notably, this functional block, in other embodiments, may be in a different or its own sublayer. Clock interfacing 328 is configured to interface first clock domain 312 with second clock domain 314. In one embodiment, described later, clock interfacing 328 may be configured to provide a clock for second clock domain 314. In datapath 300, transition from first clock domain 312 to second clock domain 314 occurs at domain crossing 302.

In the embodiment of FIG. 3, second clock domain 314 includes an interface 308 and a harmonizing sublayer 310. Interface 308 may be, as a non-limiting example, a version of a media independent interface (MII) where second clock domain does not comply with a bit rate specified for MII. Interface 308 includes receive data line 330 that is configured for storage and/or transmission of data received from the first clock domain 312, more specifically, transmission of data from physical layer side 316 to link layer side 318 of datapath 300.

Harmonizing sublayer 310 is configured, generally, to synchronize a bit rate of receive data line 330 and receive data line 332 to a bit rate of an interface at the link layer side 318. As a non-limiting example, harmonizing sublayer 310 is configured to synchronize a bit rate corresponding to the second clock domain 314 to a bit rate specified in MII so that an MII wrapper on the link layer side 318 may handle data correctly.

Figure 4:
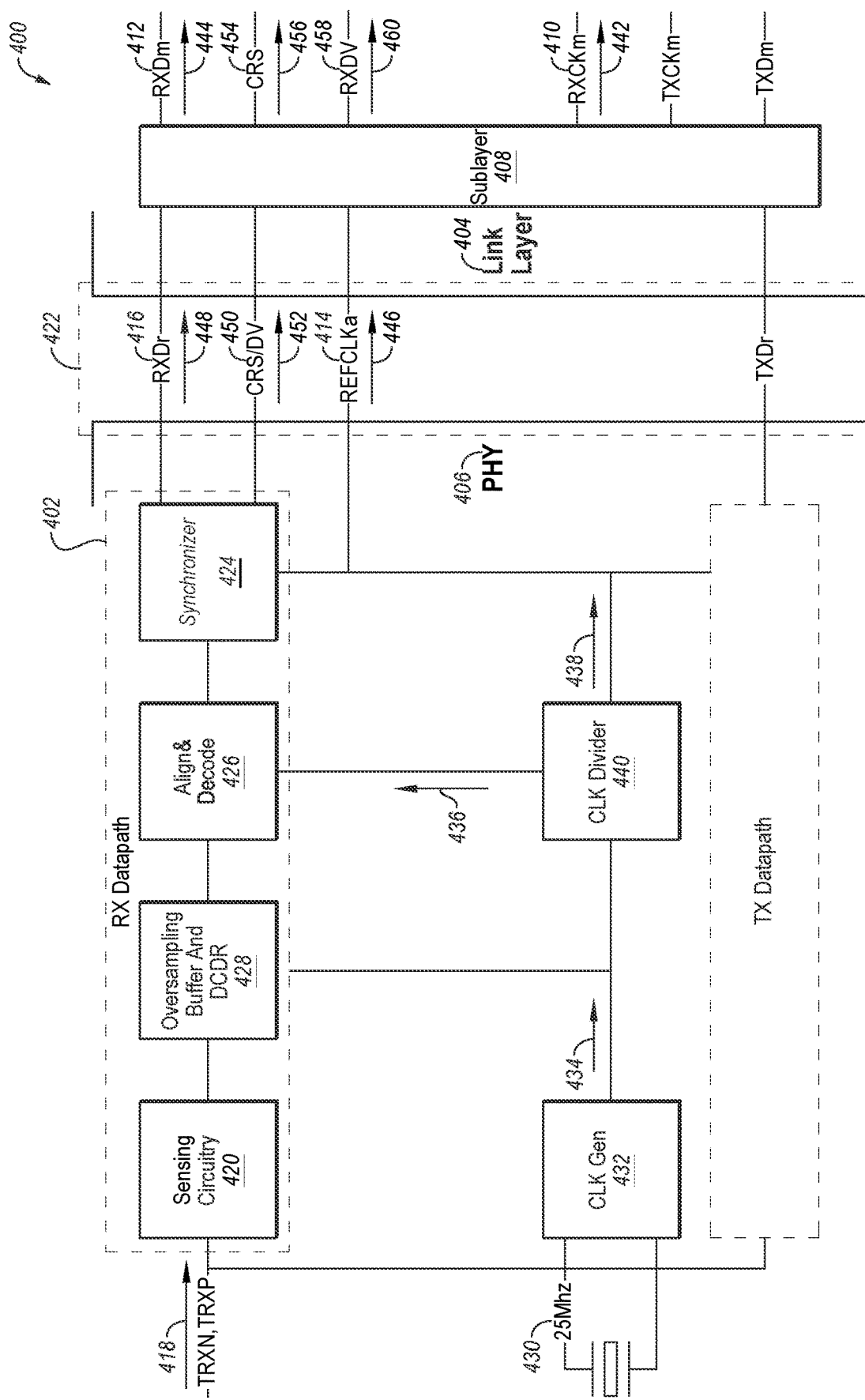
FIG. 4 illustrates a digital interface in accordance with one or more embodiments.

FIG. 4 shows a block diagram of a system 400 according to one or more embodiments. System 400 includes a PHY sub-interface 408 and link layer 404, which are operatively coupled by interface 422. PHY 406 includes a clock generator 432 configured to generate local clock 434 based on crystal oscillator 430, which is located at PHY 406. Clock divider 440 is configured to generate divided clock 438 in response to local clock 434. In one embodiment, clock divider 440 is configured to divide local clock 434 in response to control bits (not shown). In one embodiment, the control bits may be one or more bits that set an integer divisor for dividing local clock 434.

In one embodiment, optionally, clock divider 440 may be configured to provide clock information 436 to receive datapath 402, and more specifically to align and decode 426. The clock information 436 may include phase and/or edge information about divided clock 438, and align and decode 426 may be configured to perform symbol alignment on respective positive or negative phases of divided clock 438.

As a non-limiting example, align and decode 426 may be configured to perform symbol alignment to align symbols of receive data 418 on respective positive and negative phases of a clock signal (effectively doubling a data rate of interface 422). As another non-limiting example, align and decode 426 may be configured to perform symbol alignment of collision avoidance signals and other signals, such as a valid data signal (e.g., for indicating valid data is available to link layer 404 at interface 422, without limitation). Combined carrier sense and data valid line, CRS/DV 450 of FIG. 4, is a non-limiting example of a line for non-exclusive collision avoidance signaling because it is used for a signal, combined carrier sense and data valid 452, that has on one of the phases of a clock, a carrier sense signal indicating carrier activity usable by a CSMA/CD MAC, and has on the other one of the phases of the clock a data valid signal indicating valid data is available to a MAC at interface 422.

Interface 422 receives divided clock 438 and is clocked using divided clock 438. Divided clock 438 has a rate that is equal to or less than the bit rate at which interface 422 is configured to send data on receive data line 416. Divided clock 438 is also equal to or less than a clock rate of a reference clock that interface 422 is configured to provide on reference clock line 414 together with data on receive data line 416—i.e., provided from PHY 406 to link layer 404.

Synchronizer 424 is configured to synchronize sending at least some of the signals across interface 422. In FIG. 4, synchronizer 424 is at least configured to send receive data 448 and the combined carrier sense/data valid signal CRS/DV 452.

Sub-interface 408 is configured to receive data 448 on receive data line 416 and a reference clock 446 on reference clock line 414. In response to the reference clock 446 and receive data 448, provide interface receive data 444 on interface receive data line 412 and provide interface reference clock 442 on interface reference clock line 410.

In one embodiment, interface receive data 444 and interface reference clock 442 have a bit rate and a clock rate, respectively, that are expected by a link layer side of interface 422. As a non-limiting example, interface 422 may be configured, at least in part, according to an interface definition that specifies a 50 megahertz reference clock (e.g., RMII without limitation). In a contemplated use case, a physical layer side (i.e., PHY 406) of interface 422 provides a 5 megahertz reference clock 446 to the link layer side (i.e., MAC 104) of interface 422 over reference clock line 414. In such contemplated use case, sub-interface 408 generates an interface reference clock 442 at interface reference clock line 410 that is 50 megahertz. Similarly, if a bit rate of receive data 448 provided by the physical layer side of interface 422 on receive data line 416 is different than a bit rate expected by the link layer side of interface 422, then sub-interface 408 aligns the bit rates of the receive data 448 to a bit rate of the link layer side of interface 422, and obtains interface receive data 444 that is at the expected bit rate.

In some embodiments, interface 422 may include circuitry used to align bit rates or generate clocks at specified clock rates. Sub-interface 408 may be configured to use or modify operation of such circuitry to account for differences between an expected clock rate and/or bit rate and the clock rate and/or bit rate of reference clock 446 and interface receive data 448, respectively.

One of ordinary skill in the art would recognize many advantages and benefits to the embodiments disclosed herein. As a non-limiting example, a faster local clock may be used to operate the circuitry and components of an Ethernet physical layer while a slower clock and bit rate may be provided across an interconnect to a MAC. The slower clock rate and bit rate may reduce EME from a node or PHY.

In some contemplated use cases, reduced EME will reduce interference with other devices, systems or sub-systems in a network or an environment where a PHY according to disclosed embodiments is deployed.

Notably, PHY 406 may also be characterized as a digital interface between link layer 404 and a link layer more generally, and a cable/transmission medium, such as shared transmission medium 106.

Any characterization in this disclosure of something as "typical," "conventional," or "known" does not necessarily mean that it is disclosed in the prior art or that the discussed aspects are appreciated in the prior art. Nor does it necessarily mean that, in the relevant field, it is widely known, well-understood, or routinely used.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

Additional non-limiting embodiments of the disclosure include:

Embodiment 1: A method, comprising: generating a clock; clocking, using the clock, a datapath of an Ethernet physical layer at a first clock rate; clocking, using the clock, a first interface for operatively coupling the Ethernet physical layer with an Ethernet link layer, wherein clocking the first interface comprises clocking the first interface at a second clock rate that is equal to or less than a bit rate of the first interface; and synchronizing the bit rate and the clock rate of the first interface with a bit rate and a clock rate of a second interface at the Ethernet link layer.

Embodiment 2: The method of Embodiment 1, wherein generating the clock at a first frequency comprises generating the clock at the first frequency at a crystal oscillator.

Embodiment 3: The method of any of Embodiments 1 and 2, further comprising generating a divided clock responsive to the clock.

Embodiment 4: The method of any of Embodiments 1 through 3, wherein clocking the interface at the second clock rate that is substantially equal to a bit rate of the interface comprises clocking, using the divided clock, the interface at the second clock rate that is substantially equal to the bit rate of the interface.

Embodiment 5: The method of any of Embodiments 1 through 4, wherein the second clock rate is substantially 5 megahertz and the first clock rate is substantially 25 megahertz.

Embodiment 6: The method of any of Embodiments 1 through 5, wherein the second clock rate is substantially 2.5 megahertz and the first clock rate is substantially 25 megahertz.

Embodiment 7: The method of any of Embodiments 1 through 6, further comprising crossing over from a first clock domain to a second clock domain at the datapath, wherein the first clock domain is associated with the first clock rate and the second clock domain is associated with the second clock rate.

Embodiment 8: The method of any of Embodiments 1 through 7, further comprising choosing the second clock rate of the first interface responsive to an electromagnetic emissions (EME) limit.

Embodiment 9: A system, comprising: a datapath of an Ethernet physical layer, the datapath configured for a first clock rate; a first interface for operatively coupling the Ethernet physical layer to an Ethernet link layer, the first interface configured for a second clock rate that is less than or equal to a bit rate of the first interface; a clock generator configured to generate a clock for clocking the datapath and for clocking the first interface; and a harmonizing layer of the Ethernet link layer, the harmonizing layer configured to synchronize the bit rate and the clock rate of the first interface with a bit rate and a clock rate of a second interface.

Embodiment 10: The system of Embodiment 9, wherein the datapath comprises a clock and data recovery circuitry.

Embodiment 11: The system of any of Embodiments 9 and 10, further comprising a clocking interface configured to provide a divided clock responsive to the clock.

Embodiment 12: The system of any of Embodiments 9 through 11, wherein the datapath is configured to cross over from a first clock domain to a second clock domain responsive to one or more control signals received from the clocking interface.

Embodiment 13: The system of any of Embodiments 9 through 12, wherein the first clock domain is associated with the first clock rate and the second clock domain is associated with the second clock rate.

Embodiment 14: The system of any of Embodiments 9 through 13, wherein the second clock rate is substantially 5 megahertz and the first clock rate is substantially 25 megahertz.

Embodiment 15: The system of any of Embodiments 9 through 14, wherein the second clock rate is substantially 2.5 megahertz and the first clock rate is substantially 25 megahertz.

Embodiment 16: The system of any of Embodiments 9 through 15, wherein the first interface comprises one or more outputs, and an output of the one or more outputs is assigned to a signal for non-exclusive collision avoidance signaling.

What is claimed is:

1. A method, comprising:
   clocking, using a first clock, a datapath of an Ethernet physical layer at a first clock rate; and
   clocking, using a second clock generated based on the first clock, a first interface for operatively coupling the Ethernet physical layer with an Ethernet link layer, wherein clocking the first interface comprises clocking the first interface at a second clock rate that is substantially equal to a bit rate of the first interface.

2. The method of claim 1, further comprising generating the first clock via a crystal oscillator.

3. The method of claim 1, further comprising generating a divided clock responsive to the first clock.

4. The method of claim 3, wherein clocking the first interface at the second clock rate that is substantially equal to a bit rate of the first interface comprises clocking, using the divided clock, the first interface at the second clock rate.

5. The method of claim 1, wherein the second clock rate is either substantially 5 megahertz or substantially 2.5 megahertz and the first clock rate is substantially 25 megahertz.

6. The method of claim 1, wherein clocking using the second clock comprises clocking using the second clock that has a frequency that is associated with lower electromagnetic emissions (EME) than a frequency of the first clock.

7. The method of claim 1, further comprising crossing over from a first clock domain to a second clock domain at the datapath, wherein the first clock domain is associated with the first clock rate and the second clock domain is associated with the second clock rate.

8. The method of claim 1, further comprising choosing the second clock rate of the first interface responsive to an electromagnetic emissions (EME) limit.

9. A system, comprising:
   a datapath of an Ethernet physical layer, the datapath configured for a first clock rate; and
   a first interface for operatively coupling the Ethernet physical layer to an Ethernet link layer, the first interface configured for a second clock rate that is substantially equal to a bit rate of the first interface.

10. The system of claim 9, wherein the datapath comprises a clock and data recovery circuitry.

11. The system of claim 9, further comprising a clocking interface configured to provide a divided clock responsive to a clock corresponding to the first clock rate.

12. The system of claim 11, wherein the datapath is configured to cross over from a first clock domain to a second clock domain responsive to one or more control signals received from the clocking interface.

13. The system of claim 12, wherein the first clock domain is associated with the first clock rate and the second clock domain is associated with the second clock rate.

14. The system of claim 12, wherein the first clock domain comprises a physical medium attachment (PMA) sublayer and a physical coding (PC) sublayer, and the second clock domain comprises the first interface and a harmonizing sublayer.

15. The system of claim 9, wherein the second clock rate is either substantially 5 megahertz or substantially 2.5 megahertz and the first clock rate is substantially 25 megahertz.

16. The system of claim 9, wherein the first interface comprises one or more outputs, and an output of the one or more outputs is assigned to a signal for non-exclusive collision avoidance signaling.

17. A method, comprising:
   clocking a datapath of an Ethernet physical layer at a first clock rate; and
   clocking a first interface at a second clock rate that is substantially equal to a bit rate of the first interface, the first interface for operatively coupling the Ethernet physical layer with an Ethernet link layer.

18. The method of claim 17, further comprising:
   generating a first clock having the first clock rate; and
   generating, responsive to the first clock, a second clock having the second clock rate.

19. The method of claim 18, further comprising selecting a frequency of the second clock responsive to an electromagnetic emissions (EME) limit.

20. The method of claim 18, further comprising providing information about the second clock to the datapath.

\* \* \* \* \*